(12) United States Patent
Skelton et al.

(10) Patent No.: US 9,493,888 B2
(45) Date of Patent: Nov. 15, 2016

(54) AUTOMATED VISION SYSTEM FOR A CRYSTAL GROWTH APPARATUS

(75) Inventors: Dean C. Skelton, Fitzwilliam, NH (US); Brett C. Forlano, Avon, CO (US)

(73) Assignee: GTAT Corporation, Merrimack, NH (US)

( * ) Notice: Subject to any disclaimer, the term of this patent is extended or adjusted under 35 U.S.C. 154(b) by 884 days.

(21) Appl. No.: 13/418,665

(22) Filed: Mar. 13, 2012

(65) Prior Publication Data

US 2012/0282162 A1  Nov. 8, 2012

Related U.S. Application Data

(60) Provisional application No. 61/452,919, filed on Mar. 15, 2011.

(51) Int. Cl.
 *C30B 11/00* (2006.01)
 *C30B 29/06* (2006.01)
 *C30B 29/20* (2006.01)

(52) U.S. Cl.
 CPC ............. *C30B 11/006* (2013.01); *C30B 29/06* (2013.01); *C30B 29/20* (2013.01)

(58) Field of Classification Search
 CPC combination set(s) only.
 See application file for complete search history.

(56) References Cited

U.S. PATENT DOCUMENTS

| 5,037,621 | A | 8/1991 | Kennedy et al. | |
|---|---|---|---|---|
| 6,203,610 | B1* | 3/2001 | Altekruger et al. | 117/14 |
| 6,454,851 | B1 | 9/2002 | Fuerhoff et al. | |
| 6,570,663 | B1* | 5/2003 | Altukoff | G01B 11/105 356/243.1 |
| 8,101,019 | B2 | 1/2012 | Sahr et al. | |
| 2007/0044707 | A1* | 3/2007 | Schmid et al. | 117/11 |
| 2009/0116019 | A1 | 5/2009 | Stoddard et al. | |
| 2009/0158993 | A1 | 6/2009 | Sahr et al. | |

FOREIGN PATENT DOCUMENTS

| CN | 101463497 A | 6/2009 |
|---|---|---|
| EP | 2 072 645 A2 | 6/2009 |
| JP | S62278186 A | 12/1987 |
| JP | 2001-505523 A | 4/2001 |

(Continued)

OTHER PUBLICATIONS

European Search Report dated Jul. 9, 2014 in connection with European Application No. 12756904.4.

(Continued)

*Primary Examiner* — Duy Deo
*Assistant Examiner* — Erin Bergner
(74) *Attorney, Agent, or Firm* — Parker Ibrahim & Berg LLC; Stephen D. LeBarron

(57) ABSTRACT

Various embodiments of a method for producing a crystalline material in a crucible in a crystal growth apparatus are disclosed. The method comprises, in part, the step of monitoring for remaining solid feedstock in a liquid feedstock melt with an automated vision system positioned above the crucible. Alternatively, or in addition, the method comprises the step of monitoring for solidified crystalline material in a partially solidified melt with the automated vision system. A crystal growth apparatus comprising the automated vision system is also disclosed.

14 Claims, 8 Drawing Sheets

(56) References Cited

FOREIGN PATENT DOCUMENTS

| JP | 2001-510141 A | 7/2001 |
|---|---|---|
| JP | 2009-505935 A | 2/2009 |
| TW | 200938664 A | 9/2009 |
| WO | WO-2009/015356 | 1/2009 |
| WO | 2009042503 A1 | 4/2009 |
| WO | WO-2010/005705 A1 | 1/2010 |

OTHER PUBLICATIONS

Lan, C.W. et al., "Growth of benzil crystals by vertical dynamic gradient freeze technique in a transparent furnace," Journal of Crystal Growth, Elsevier, Amsterdam, NL, vol. 180, No. 1, Sep. 1, 1997, pp. 127-135.
International Search Report dated Oct. 4, 2012 for PCT/US2012/028056.
Examination Report dated Jul. 24, 2015 in connection with Taiwan Application No. 101108584.
First Office Action dated Aug. 18, 2015 in connection with Chinese Application No. 201280023475.1.
Japanese Office Action datd Jul. 7, 2015 in connection with Japanese Application No. 2013-558052, with English translation.
European Office Action Issued Jun. 17, 2016 in connection with corresponding European Patent Application No. 12 756 904.4.

* cited by examiner

AUTOMATED VISION SYSTEM FOR A CRYSTAL GROWTH APPARATUS

CROSS REFERENCE TO RELATED APPLICATIONS

This Application claims the benefit of U.S. Provisional Application Ser. No. 61/452,919, filed on Mar. 15, 2011, the entire contents of which are hereby incorporated by reference.

BACKGROUND OF THE INVENTION

1. Field of the Invention

The present invention relates to a method of producing a crystalline material using an automated vision system as part of a crystal growth apparatus.

2. Description of the Related Art

Crystal growth apparatuses or furnaces, such as directional solidification systems (DSS) and heat exchanger method (HEM) furnaces, involve the melting and controlled resolidification of a feedstock material, such as silicon, in a crucible to produce an ingot. Production of a solidified ingot from molten feedstock occurs in several identifiable steps over many hours. For example, to produce a silicon ingot by the DSS method, solid silicon feedstock is provided in a crucible, often contained in a graphite crucible box, and placed into the hot zone of a DSS furnace. The feedstock is then heated to form a liquid feedstock melt, and the furnace temperature, which is well above the silicon melting temperature of 1412° C., is maintained for several hours to ensure complete melting. Once fully melted, heat is removed from the melted feedstock, often by applying a temperature gradient in the hot zone, in order to directionally solidify the melt and form a silicon ingot. By controlling how the melt solidifies, an ingot having greater purity than the starting feedstock material can be achieved, which can then be used in a variety of high end applications, such as in the semiconductor and photovoltaic industries.

In such a method, it is often a challenge to accurately identify when the feedstock has fully melted and/or when the growth of the ingot is complete. Missing either or both of these events in the process can have deleterious effects on the quality of the resulting crystalline material. For example, if a silicon feedstock is fully melted but remains at the high melting temperature for an excessive amount of time, the quantity of contaminants such as carbon and oxygen in the melt can increase, producing impurities that can affect the overall performance of the final silicon ingot. In addition, missing the end of melt also has a substantial negative impact on the rest of the solidification process, particularly on the timing and temperatures of subsequent steps. Furthermore, for the solidification step, improper identification of the completion of growth results in a fully grown solid ingot being subjected to significant thermal gradients, which can cause damage to the final ingot. Typically, the end of melt and the completion of growth are determined based on internal temperature readings and confirmed manually by an operator looking into the furnace. However, this has often proven to be unreliable or, at best, inconsistent.

Thus, there is a need in the industry for methods and devices that can monitor the melting of a feedstock in a crystal growth apparatus in order to determine when melting is complete and/or can monitor the growth of a crystalline material from a fully melted feedstock to determine when growth is complete.

SUMMARY OF THE INVENTION

The present invention relates to a method of producing a crystalline material which, in one embodiment, comprises the steps of providing a crucible containing a solid feedstock in a hot zone of a crystal growth apparatus; heating the solid feedstock in the crucible to form a liquid feedstock melt; monitoring for remaining solid feedstock in the liquid feedstock melt with an automated vision system positioned above the crucible; and ending the heating of the solid feedstock when no remaining solid feedstock is detected by the automated vision system. For this embodiment, the method may further comprise the steps of removing heat from the liquid feedstock melt to form the crystalline material and subsequently annealing the crystalline material.

The present invention also relates to a method of producing a crystalline material which, in another embodiment, comprises the steps of providing a crucible containing a solid feedstock in a hot zone of a crystal growth apparatus; heating the solid feedstock in the crucible to form a liquid feedstock melt; removing heat from the liquid feedstock melt to form a partially solidified melt; monitoring for solidified crystalline material in the partially solidified melt with an automated vision system positioned above the crucible; fully solidifying the partially solidified melt to form the crystalline material; and ending the heat removal upon full solidification.

The present invention also relates to a method of producing a crystalline material which, in yet another embodiment, comprises the steps of providing a crucible containing a solid feedstock in a hot zone of a crystal growth apparatus; heating the solid feedstock in the crucible to form a liquid feedstock melt; monitoring for remaining solid feedstock in the liquid feedstock melt with an automated vision system positioned above the crucible; and ending the heating of the solid feedstock when no remaining solid feedstock is detected by the automated vision system. For this embodiment, the method further comprises the steps of removing heat from the liquid feedstock melt to form a partially solidified melt; monitoring for solidified crystalline material in the partially solidified melt with the automated vision system; fully solidifying the partially solidified melt to form the crystalline material; and ending the heat removal upon full solidification.

The present invention further relates to a crystal growth apparatus comprising a chamber, a hot zone comprising at least one heating system inside the chamber, a crucible containing a solid feedstock within the hot zone, at least one means for removing heat from the hot zone, and an automated vision system positioned above the crucible. The automated vision system is positioned to view the solid feedstock, particularly a surface center portion thereof.

It is to be understood that both the foregoing general description and the following detailed description are exemplary and explanatory only and are intended to provide further explanation of the present invention, as claimed.

BRIEF DESCRIPTION OF THE DRAWINGS

FIG. 1A and FIG. 1B are images of a surface center portion of a liquid silicon feedstock melt with remaining solid silicon feedstock. FIG. 1C is an image of a surface center portion of a liquid silicon feedstock melt with no remaining solid silicon feedstock.

FIG. 2A is an image of a surface center portion of a partially solidified silicon ingot with no solidified silicon visible. FIG. 2B and 2C are images of a surface center portion of a partially solidified silicon ingot with solidified silicon visible. FIG. 2D is an image of a surface center portion of a fully solidified silicon ingot.

DETAILED DESCRIPTION OF THE INVENTION

Figure 1A:
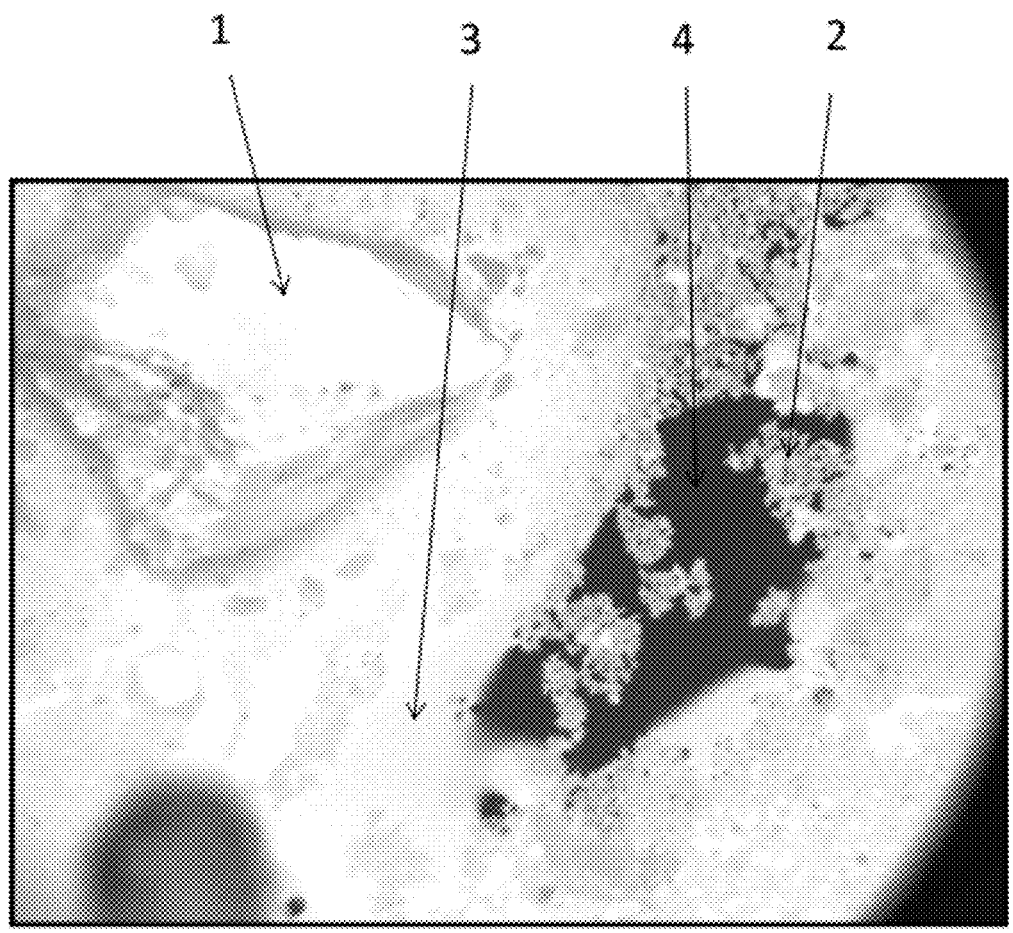
FIG. 1A-1C are images from an automated vision system used in an embodiment of the method of the present invention.

The present invention relates to a crystal growth apparatus with an automated vision system and to methods of growing a crystalline material using an automated vision system.

The method of the present invention is a method of producing a crystalline material, including, for example, a silicon ingot or sapphire. The method comprises the steps of providing a crucible containing a solid feedstock, such as silicon or alumina, in a hot zone of a crystal growth apparatus, heating the solid feedstock in the crucible, thereby producing a liquid feedstock melt, and removing heat from the liquid feedstock melt to form the crystalline material. The method may further comprise the step of annealing the crystalline material prior to final cooling and removal of the product from the crystal growth apparatus. Various embodiments of this method will be described below.

The crucible used in the method of the present invention can be any container known in the art for holding, melting, and resolidifying a feedstock material. The crucible may be made of various heat resistant materials, for example, quartz, silica, graphite, or molybdenum, depending on a variety of factors, including the type of feedstock. For example, for a silicon-containing feedstock, quartz crucibles can be used. In addition, the crucible can be cylindrical or square in cross section and/or can be tapered, optionally coated to prevent cracking of the ingot after solidification. Preferably, the crucible is contained within a crucible box in order to provide added stability and rigidity. The crucible box typically comprises at least one side plate and a bottom plate, and may optionally further comprise a lid. For example, for a square crucible, the crucible box is also square, having four walls and a bottom plate, with an optional lid.

The crucible containing the solid feedstock is provided in a hot zone of a crystal growth apparatus, which can be any device or apparatus, such as a high-temperature furnace, having a chamber (such as a water-cooled outer chamber) with an interior hot zone that is used to heat and melt a feedstock material, such as silicon, generally at temperatures greater than about 1000° C., and subsequently to promote re-solidification of the melted feedstock material. For example, the crystal growth apparatus can be a crystal growth furnace, including a directional solidification system (DSS) furnace or a heat exchanger method (HEM) furnace. The hot zone within the chamber of the crystal growth apparatus comprises at least one heating system, such as multiple heating elements, to provide heat to the crucible to melt the solid feedstock therein. For example, the hot zone can comprise a top heating element, positioned in the upper region of the hot zone above the crucible, and at least one side heating element positioned below the top heating element and along the sides of the hot zone and the crucible. The hot zone also comprises insulation that surrounds and defines the hot zone, and, further, may comprise a crucible support block raised upon multiple pedestals upon which the crucible and crucible box can be placed.

In the method of the present invention, the feedstock-containing crucible provided in the crystal growth apparatus hot zone is heated to form a liquid feedstock melt. The method of heating used depends on the type of heating system in the hot zone. For example, the solid feedstock in the crucible can be heated and melted by regulating the power to the heating system, such as one or more heating elements in the hot zone.

The heating of the feedstock initially forms a partially liquefied or melted feedstock mixture comprising a liquid feedstock phase and a solid feedstock phase. For example, for a silicon feedstock, remaining solid feedstock is typically found floating on or near the surface of the liquid melt due to its lower density. As heating and melting continues, the amount of the solid feedstock phase decreases. In the method of the present invention, the heating is continued until all of the solid feedstock has been melted, thereby producing a liquid feedstock melt having no remaining solid feedstock.

However, as discussed above, it is difficult to accurately determine when all of the solid feedstock has melted and no remaining solid feedstock is present in the melt. For example, typically a thermocouple placed within the crystal growth apparatus monitors the temperature within the hot zone, and an increase in temperature in the hot zone during the melting of the solid feedstock acts as a signal indicating that most of the remaining solid feedstock has melted. An operator is then required to visibly inspect the status of melt by viewing into the top of the crystal growth apparatus, typically through a sight glass or view port positioned above the top of the crucible. Such a method is tedious, time consuming, and inconsistent since it depends on how quickly the operator can get positioned to the top of the apparatus and how effectively that operator can determine whether any remaining solid feedstock is visible in the melt.

To overcome this difficulty, in one embodiment of the method of the present invention, the liquid feedstock melt is formed and monitored for remaining solid feedstock using an automated vision system positioned above the crucible. Preferably the automated vision system is attached outside the crystal growth apparatus and, more particularly, above the center of the crucible, which provides the vision system with a view of the center of the surface of the liquid feedstock melt. The automated vision system can be any vision system capable of accurately distinguishing liquid feedstock from solid feedstock. For example, the automated vision system may be a programmable camera that can produce multiple images of the liquid feedstock melt surface and, further, can accurately detect the presence of small amounts of solid feedstock, such as with an image analysis software program either external or internal to the camera. Such a system may produce images based on a variety of differentiating characteristics between the liquid and solid feedstock, including, but not limited to, differences in reflectivity or differences in color (i.e., visible imaging). However, the automated vision system used in the present method differs significantly from and provides significant improvement over typically available devices for monitoring the contents of the crucible, such as pyrometers which rely on detecting differences in emissivity between solid and liquid feedstock and do not provide the degree of sensitivity or resolution to accurately determine when only one phase is present.

Furthermore, it is not uncommon for impurities to be present either from the solid feedstock itself or from unwanted side reactions that occur during the melting process. When present, impurities often form a separate phase in the liquid feedstock melt. For example, for silicon, impurities typically appear floating along the surface of the melt as a skin or pool. Therefore, for this embodiment of the method of the present invention, it is preferred that the automated vision system is also capable of monitoring for remaining solid feedstock in the liquid feedstock melt without interference from any impurity phase. Thus, a fully melted liquid feedstock, with no remaining solid feedstock, can be formed and accurately identified even in the presence of at least one impurity phase.

Since this vision system is automated, no direct operator involvement is needed to decide or confirm that remaining solid feedstock is not present. The vision system automatically monitors the surface of the liquid feedstock melt for remaining solid feedstock in order to accurately determine when all of the feedstock has melted. The monitoring can be in specific time increments (such as using time-lapsed photography producing individual or separate images over time intervals of from about every 5 minutes or less, every 2 minutes or less, every minute or less, or every 30 seconds or less, including every 5 seconds) or it can be continuous (such as by video monitoring). If remaining solid feedstock is detected by the automated vision system, heating is continued. If no remaining solid feedstock is detected, heating is ended. Heating may be ended as an independent step after the vision system has determined that no solid feedstock remains or it can be ended directly by the vision system itself. For example, the automated vision system may detect that no solid remains in the melt and then send a signal to an operator to end the heating. Alternatively, the automated vision system may send the signal to a system controller which is capable of ending the heating, such as by lowering the power to the heating system in the hot zone of the crystal growth apparatus.

As discussed above, the method of the present invention further comprises the step of removing heat from the liquid feedstock melt to form the crystalline material, which can subsequently be annealed, if desired, prior to final cooling and removal of the product from the crystal growth apparatus. Any method known in the art can be used to remove heat to from the crystalline material. For example, in a DSS furnace, directional solidification of the melt can be achieved through controlled heat extraction from the crucible by gradually increasing radiant heat losses to the water-cooled chamber through the bottom of the hot zone. Controlled heat loss can be achieved, for example, by moving the insulation surrounding the hot zone relative to the crucible so as not to disturb the solid-liquid interface of the growing ingot. As a specific example, the insulation of the hot zone may comprise top and side insulation panels, wherein the side insulation is configured to move vertically relative to a crucible within the hot zone. As another example, a heat exchanger may be employed in the furnace, either alone or in conjunction with insulation configured to be moved relative to a crucible, to control heat extraction. A gas-cooled heat exchanger, for example, a helium-cooled heat exchanger, can be arranged beneath the crucible, to promote solidification of the melted feedstock.

As discussed above, in a typical solidification process, it is often difficult to determine when a liquid feedstock melt has fully solidified. For example, in a directional solidification system furnace, a solid-liquid growth front is formed starting near the bottom of the liquid feedstock melt that gradually rises through to the top of the melt, forming a nearly solidified material having a remaining liquid feedstock melt phase on its surface. Typically, when the solidified product has appeared above the melt surface, internal process conditions within the furnace change to promote complete growth of the product. For example, for silicon, the amount of heat emitted by the partially solidified silicon ingot changes when the amount of liquid silicon is present, and this changes the amount of power required to regulate the temperature in the hot zone. However, the change may be subtle and may be inadvertently missed by an operator who must end heat removal in a timely manner in order to avoid damaging the desired fully grown crystalline material. Furthermore, an operator may confirm growth by visibly inspecting the status of melt by viewing into the top of the crystal growth apparatus, in a manner similar to inspecting that the solid feedstock had fully melted, but, as discussed above, such a method is tedious, time consuming, and inconsistent.

To overcome this difficulty, in another embodiment of the method of the present invention, heat is removed from the liquid feedstock melt to form a partially solidified crystalline material which is monitored for solidified crystalline material using an automated vision system positioned above the crucible. Any of the heat removal methods discussed above may be used. Preferably the automated vision system is attached outside the crystal growth apparatus and, more particularly, above the center of the crucible, which provides the vision system with a view of the center of the surface of the partially solidified crystalline material. Any vision system capable of accurately distinguishing liquid feedstock from solid feedstock can be used, including those discussed above, such as a programmable camera. Also, since this vision system is automated, no direct operator involvement is needed to decide or confirm that solidified crystalline material is present. The vision system automatically monitors the surface of the partially solidified crystalline material for solidified crystalline material in order to accurately determine when growth is complete. The monitoring can be in specific time increments or it can be continuous. If no solidified crystalline material is detected by the automated vision system, heat removal is continued until solidified crystalline material is detected. Then, heat removal is ended either as an independent step initiated by the vision system or directly by the vision system itself once growth is complete. For example, the automated vision system may detect that solidified crystalline material is present and then can either send a signal to an operator or to a system controller which is capable of ending the heat removal stage.

Furthermore, it is known that impurities either from the solid feedstock or from unwanted side reactions that occur during the crystal solidification process, may be present. For example, for growing crystalline material in a DSS or HEM furnace, impurities concentrate near the surface of the partially solidified crystalline material, forming a separate phase which is typically the last to solidify. Therefore, for this embodiment of the method of the present invention, it is preferred that the automated vision system also be capable of monitoring for solidified crystalline material at the surface of the partially solidified crystalline material without interference from any impurity phase.

Also for this embodiment of the method of the present invention, after solidified crystalline material has been detected by the automated vision system, the partially solidified crystalline material is then fully solidified to form the desired crystalline material. This can subsequently be annealed, if desired, prior to final cooling and removal of the product from the crystal growth apparatus.

Thus, as discussed above, in one embodiment of the present invention, the automated vision system detects the presence of remaining solid feedstock as a liquid feedstock melt forms while, in another embodiment, the automated vision system detects the presence of solidified crystalline material in a partially solidified crystalline material during the solidification of the liquid feedstock melt. In yet another embodiment of the method of the present invention, the automated vision detects solid during both the melt and the solidification steps of a crystal growth process. Thus, for this embodiment, the method of producing a crystalline material comprises the steps of providing a crucible containing a solid feedstock in a hot zone of a crystal growth apparatus, heating the solid feedstock in the crucible to form a liquid feedstock melt, monitoring for remaining solid feedstock in the liquid feedstock melt with an automated vision system positioned above the crucible, and ending the heating of the solid feedstock when no remaining solid feedstock is detected by the automated vision system. This method further comprises the steps of removing heat from the liquid feedstock melt to form a partially solidified crystalline material, monitoring for solidified crystalline material in the partially solidified crystalline material with the automated vision system, fully solidifying the partially solidified crystalline material to form the crystalline material, and ending the heat removal upon full solidification. In this way, the difficulties discussed above associated with identifying both the end of melt and the completion of growth can be overcome.

Figure 1B:
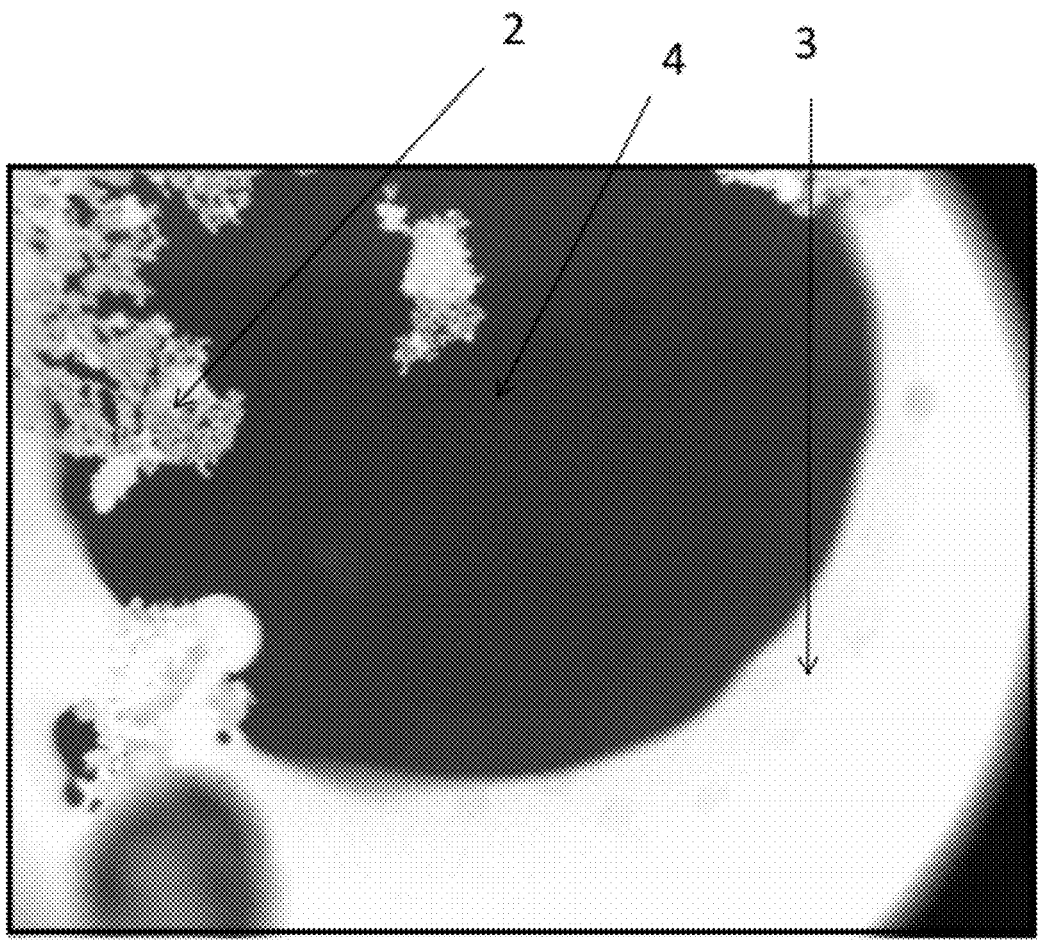
Figure 1C:
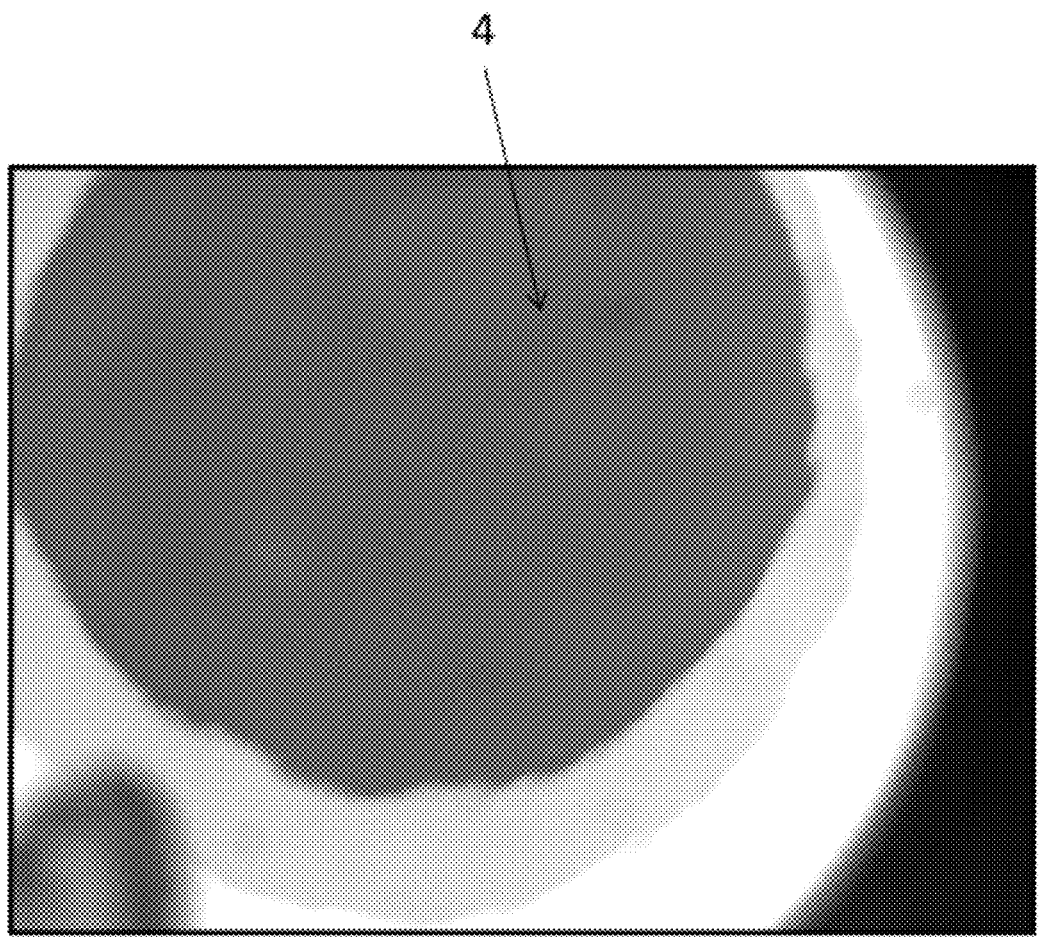

As a specific example of the method of the present invention, FIG. 1A-1C and FIG. 2A-2C each show images from a programmable camera that was attached to the outside of a DSS furnace and focused through a circular viewing port in the top of the furnace, positioned above and directly over the center of a crucible containing silicon feedstock. The feedstock was heated to form a liquid silicon melt and then directionally solidified to form a silicon ingot using a standard DSS process. Images were collected 5 seconds during both the melt stage and the growth (i.e., solidification) stage. FIG. 1A-1C are selected time-lapse images taken during the melt stage of one DSS furnace experimental run while FIG. 2A-2D are selected time-lapse images taken during the growth or solidification stage of a second run. The round edge visible in each of these images is the edge of the viewing port.

FIG. 1A is an image of the surface center portion of a liquid silicon feedstock melt that was produced in which remaining solid silicon feedstock as large pieces 1 and small flakes 2 can be seen floating in the liquid silicon feedstock melt 3. As heating continued, most of the remaining solid silicon feedstock melted, as seen in FIG. 1B, which is an image of the surface center portion of the resulting liquid silicon feedstock melt in which only these small pieces 2 are visible. With additional heating, these also melted, and FIG. 1C is an image of the surface center portion of the resulting fully melted feedstock. As can be seen, no remaining solid silicon feedstock has been detected, indicating that melt is complete. Only liquid silicon feedstock melt can be seen. The darker portion 4 seen in each of these images is a reflection of the circular viewing port off of the highly reflective liquid silicon surface. The image shown in FIG. 1C corresponded with the internal temperature measurements taken within the furnace that also indicated melt was complete. Thus, the automated vision system can be used to monitor the surface of the melt and can readily detect the presence of solid feedstock, accurately determining the end of melt. This vision system could therefore be used to end the heating of the feedstock just as the solid feedstock has melted in order to begin directional solidification of the resulting liquid silicon feedstock melt.

Figure 2A:
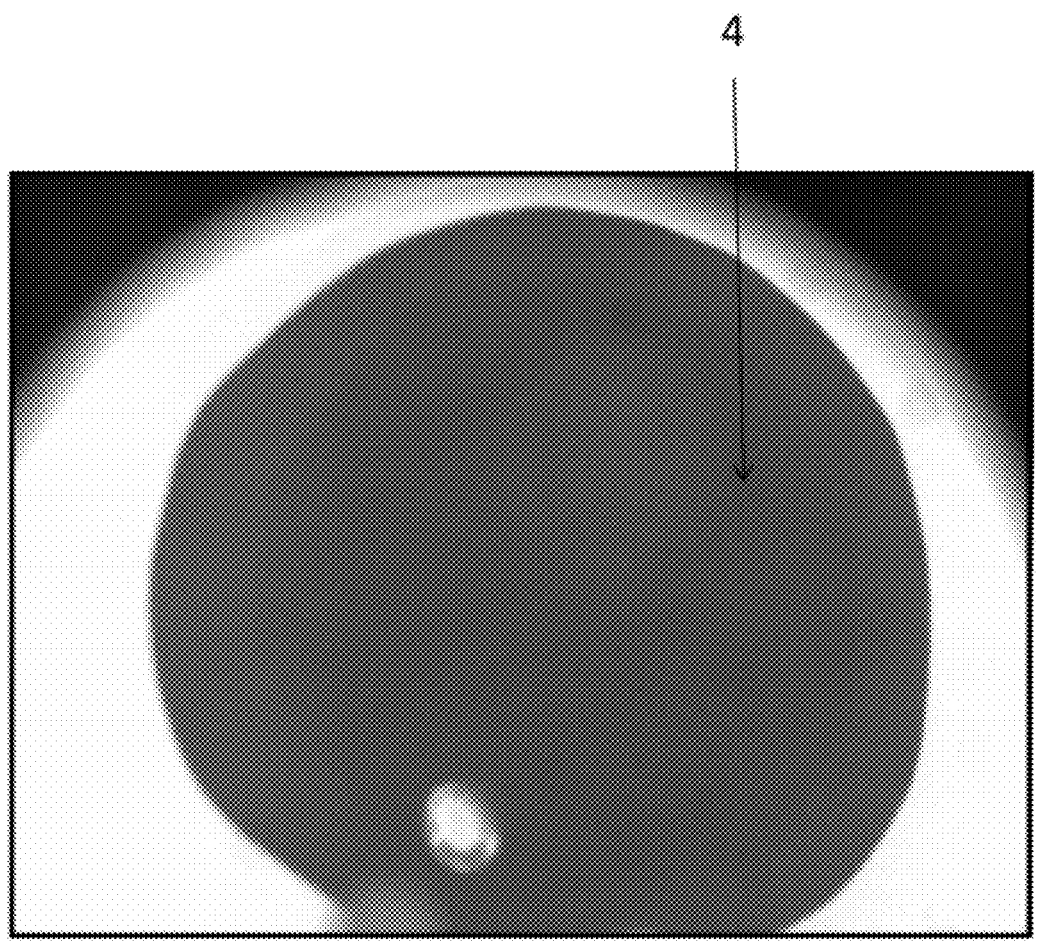
FIG. 2A-2D are images from an automated vision system used in an embodiment of the method of the present invention.
Figure 2B:
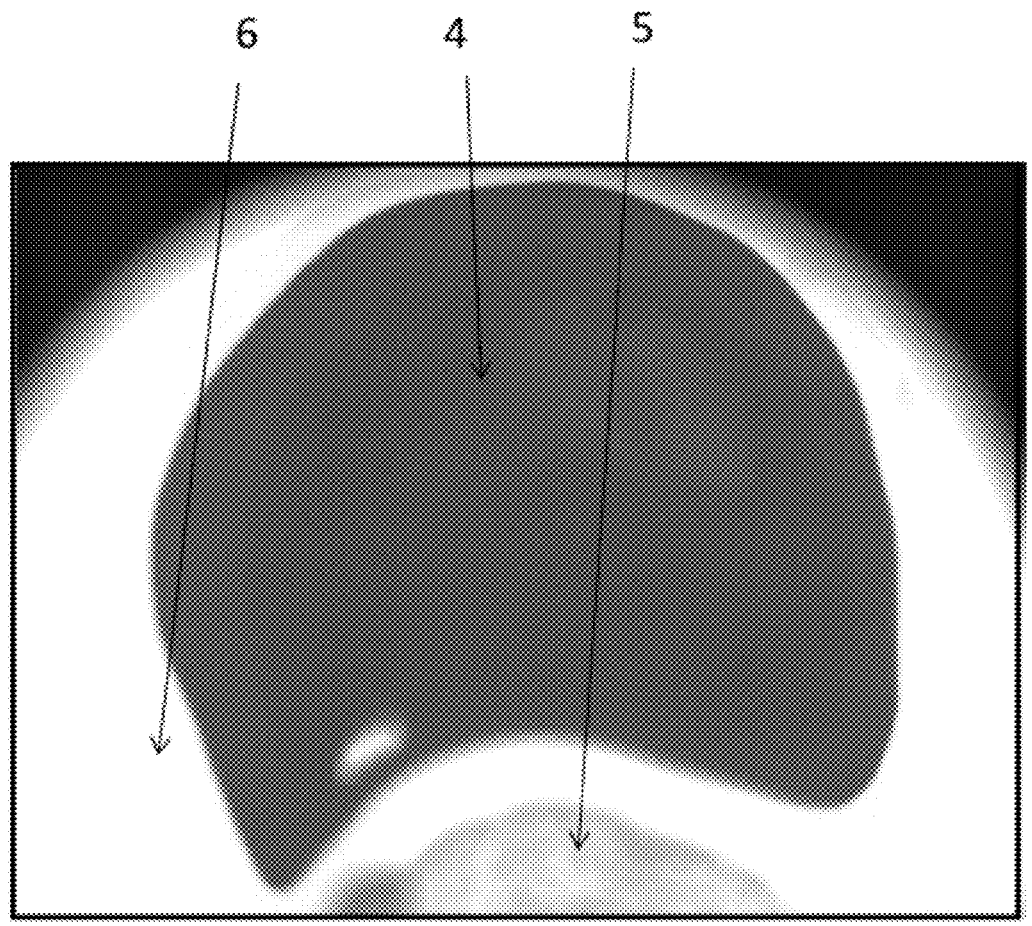
Figure 2C:
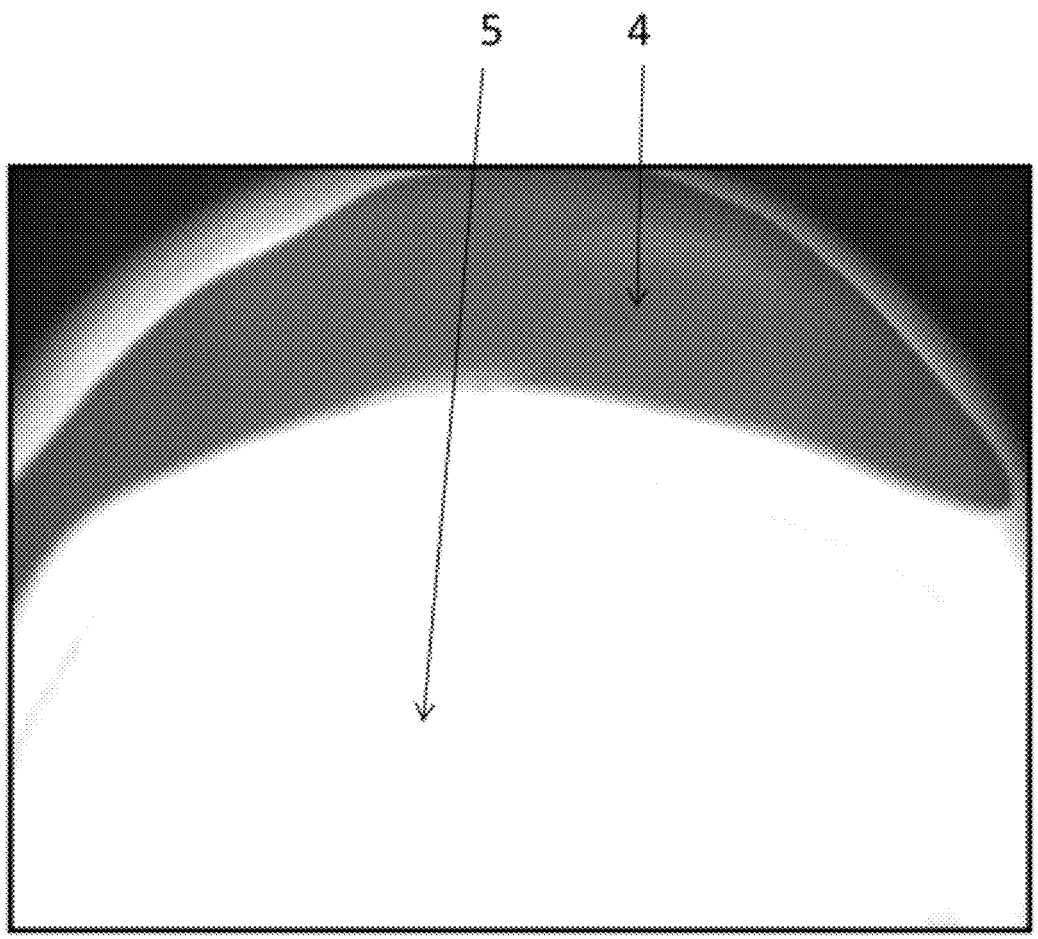
Figure 2D:
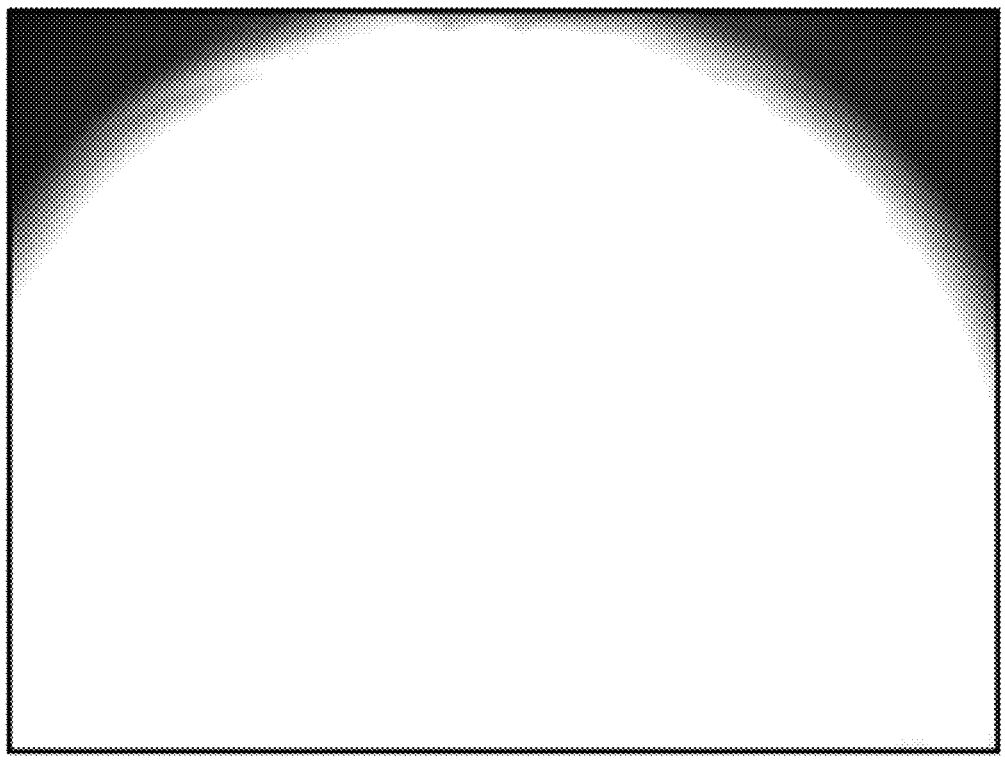

FIG. 2A, FIG. 2B, FIG. 2C, and FIG. 2D are images taken during the formation of a silicon ingot by directional solidification from a liquid silicon melt. In particular, FIG. 2A is an image of the surface center portion of a partially solidified silicon material near the end of the growth stage in which no solidified silicon (i.e., the growing silicon ingot) has yet been observed. FIG. 2B is a subsequent image as heat removal is continued, with the solidified silicon ingot 5 becoming visible as the remaining liquid silicon feedstock melt 6 decreases. FIG. 2C is a subsequent image showing the solidified silicon ingot 5 has expanded. As in FIG. 1A-1C, the darker portion 4 seen in each of these images is a reflection of the circular viewing port off of the highly reflective liquid silicon surface. No reflection is seen off of the less reflective solidified silicon ingot 5. This is also shown in FIG. 2D, which is an image of the final fully grown silicon ingot with no remaining liquid silicon feedstock melt visible. In this image, growth is complete. Thus, the automated vision system can also be used to monitor the surface of the melt during growth and can readily detect the presence of the growing silicon material. This vision system therefore could be used to accurately determine end of growth and can be used to end heat removal upon formation of a fully grown ingot.

The present invention further relates to a crystal growth apparatus comprising an automated vision system which, preferably, can be used in the method of the present invention. The crystal growth apparatus can be any of those described above, such as a DSS furnace or a HEM furnace. In one embodiment, the crystal growth apparatus comprises a chamber, a hot zone inside the chamber, and at least one means for removing heat from the hot zone. The hot zone comprises at least one heating system, such as one or more heating elements, and a crucible containing a solid feedstock. The automated vision system is positioned above the crucible, preferably being attached outside the chamber viewing a top center portion of the solid feedstock, and can be any automated vision system capable of distinguishing liquid feedstock from solid feedstock, including those discussed above. The automated vision system may further be electrically connected to the at least one heating system, the at least one means of removing heat, or both.

Figure 3:
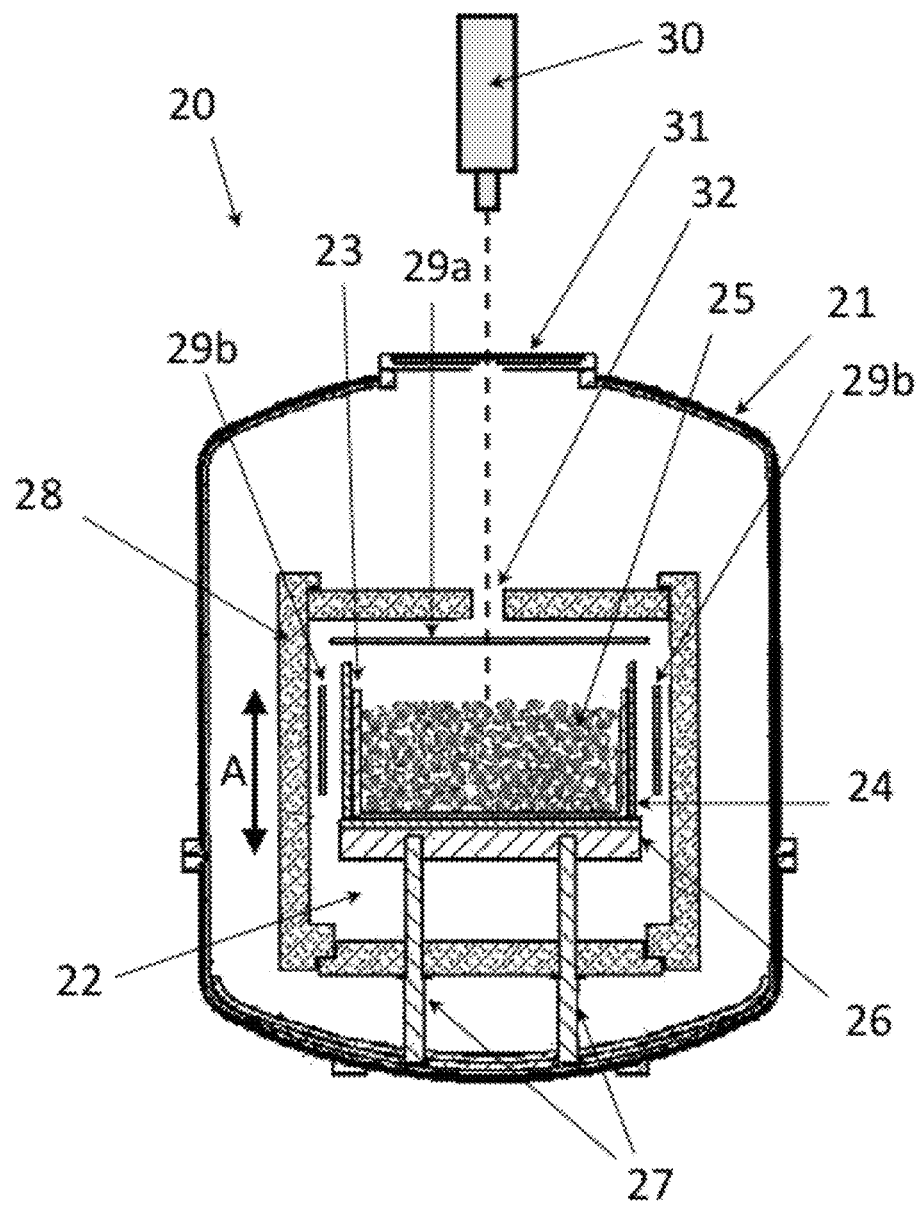
FIG. 3 is a cross-sectional view of an embodiment of the crystal growth apparatus of the present invention.

FIG. 3 is a cross-sectional view of a specific embodiment of the crystal growth apparatus of the present invention, wherein the crystal growth apparatus is a DSS furnace. However, it should be apparent to those skilled in the art that this is merely illustrative in nature and not limiting, being presented by way of example only. Numerous modifications and other embodiments are within the scope of one of ordinary skill in the art and are contemplated as falling within the scope of the present invention. In addition, those skilled in the art should appreciate that the specific configuration is exemplary and that actual configurations will depend on the specific system. Those skilled in the art will also be able to recognize and identify equivalents to the specific elements shown, using no more than routine experimentation.

Crystal growth apparatus 20 shown in FIG. 3 comprises outer chamber 21 and hot zone 22 within the chamber. Crucible 23 within crucible box 24 containing feedstock 25 is provided in hot zone 22 atop crucible block 26 supported on pedestals 27. Hot zone 22 is surrounded by insulation cage 28 and further includes a heating system comprising top heater 29*a* and two side heaters 29*b*. Insulation cage 28 is movable vertically, as shown by arrow A, and this is the means for removing heat from the hot zone of crystal growth apparatus 20, which exposes hot zone 22 and the elements contained therein to outer chamber 21, which is cooled using a cooling medium such as water. Crystal growth apparatus 20 further comprises automated vision system 30, which is attached outside of chamber 21 and positioned above and directly over the top and center of crucible 23. Located in this position, automated vision system 30 is focused through sight glass 31 and insulation port 32 and has a clear view of the top of feedstock 25 through a gap in top heater 29*a* (not shown). Automated vision system 30 can further be electrically connected, such as through a control system, to either of the heating elements and/or to the controller that regulates movement of the insulation cage.

The foregoing description of preferred embodiments of the present invention has been presented for the purposes of illustration and description. It is not intended to be exhaustive or to limit the invention to the precise form disclosed. Modifications and variations are possible in light of the above teachings, or may be acquired from practice of the invention. The embodiments were chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. A method of producing a crystalline material comprising the steps of:
   i) providing a crucible containing a solid feedstock in a hot zone of a crystal growth apparatus;
   ii) heating the solid feedstock in the crucible to form a liquid feedstock melt;
   iii) removing heat from the liquid feedstock melt to form a partially solidified melt;
   iv) monitoring, during a solidification stage, for solidified crystalline material in the partially solidified melt with an automated vision system positioned above the crucible, wherein when no darker portions are seen by the automated vision system, the automated vision system determines full solidification has occurred;
   v) fully solidifying the partially solidified melt to form the crystalline material; and
   vi) ending, by the automated vision system, the heat removal upon detecting full solidification by the automated vision system.

2. The method of claim 1, wherein the crystal growth apparatus is a directional solidification furnace.

3. The method of claim 1, wherein the partially solidified melt further comprises at least one impurity phase, and wherein the automated vision system monitors for solidified crystalline material in the partially solidified melt without interference from the at least one impurity phase.

4. The method of claim 1, wherein no solidified crystalline material is detected by the automated vision system in the partially solidified melt, and heat removal is continued until solidified crystalline material is detected by the automated vision system.

5. The method of claim 1, wherein the automated vision system continuously monitors for solidified crystalline material in the partially solidified melt.

6. The method of claim 1, wherein the automated vision system is a programmable camera.

7. The method of claim 1, wherein the automated vision system monitors for solidified crystalline material in a surface center portion of the partially solidified melt.

8. The method of claim 1, wherein the automated vision system is attached outside the crystal growth apparatus.

9. The method of claim 1, further comprising the step of annealing the crystalline material.

10. The method of claim 1, wherein the solid feedstock comprises silicon.

11. The method of claim 10, wherein the crystalline material is a silicon ingot.

12. The method of claim 1, wherein the solid feedstock comprises alumina.

13. The method of claim 12, wherein the crystalline material is sapphire.

14. A method of producing a crystalline material comprising the steps of:
   i) providing a crucible containing a solid feedstock in a hot zone of a crystal growth apparatus;
   ii) heating the solid feedstock in the crucible to form a liquid feedstock melt;
   iii) monitoring, during a melting stage, for remaining solid feedstock in the liquid feedstock melt with an automated vision system positioned above the crucible;
   iv) ending, by the automated vision system, the heating of the solid feedstock when no remaining solid feedstock is detected by the automated vision system;
   v) removing heat from the liquid feedstock melt to form a partially solidified melt;
   vi) monitoring, during a solidification stage, for solidified crystalline material in the partially solidified melt with the automated vision system, wherein when no darker portions are seen by the automated vision system, the automated vision system determines full solidification has occurred;
   vii) fully solidifying the partially solidified melt to form the crystalline material; and
   viii) ending, by the automated vision system, the heat removal upon detecting full solidification by the automated vision system.

* * * * *